United States Patent
Nam

(10) Patent No.: US 7,338,906 B2
(45) Date of Patent: Mar. 4, 2008

(54) METHOD FOR FABRICATING SEMICONDUCTOR DEVICE

(75) Inventor: Ki-Won Nam, Ichon-shi (KR)

(73) Assignee: Hynix Semiconductor, Inc., Kyoungki-do (KR)

( * ) Notice: Subject to any disclaimer, the term of this patent is extended or adjusted under 35 U.S.C. 154(b) by 31 days.

(21) Appl. No.: 11/114,083

(22) Filed: Apr. 26, 2005

(65) Prior Publication Data

US 2006/0046494 A1 Mar. 2, 2006

(30) Foreign Application Priority Data

Aug. 31, 2004 (KR) ............... 10-2004-0069027

(51) Int. Cl.
*H01L 21/302* (2006.01)

(52) U.S. Cl. .............. 438/713; 438/719; 438/742; 438/743

(58) Field of Classification Search ............... 438/713, 438/719, 742, 743
See application file for complete search history.

(56) References Cited

U.S. PATENT DOCUMENTS

| 6,200,907 | B1 | 3/2001 | Wang et al. | |
| 6,204,130 | B1* | 3/2001 | Gardner et al. | 438/287 |
| 6,551,941 | B2* | 4/2003 | Yang et al. | 438/714 |
| 2002/0182806 | A1* | 12/2002 | Kim | 438/257 |

FOREIGN PATENT DOCUMENTS

| JP | 11-087322 | 3/1999 |
| KR | 10-2005-0028781 A | 3/2005 |
| KR | 10-2005-0041432 A | 5/2005 |
| KR | 10-2005-0122737 A | 12/2005 |

* cited by examiner

*Primary Examiner*—Binh X. Tran
(74) *Attorney, Agent, or Firm*—Finnegan, Henderson, Farabow, Garrett, & Dunner, L.L.P.

(57) ABSTRACT

The present invention relates to a method for fabricating a semiconductor device with a fine pattern even without decreasing a line width of a photoresist pattern. The method includes the steps of: forming a target etching layer on a substrate; forming a plurality of etch mask patterns with high pattern density in a first region and a low pattern density in a second region on the target etching layer; removing a native oxide layer grown on the target etching layer such that a line width of each etch mask pattern decreases in more extents in the second region than in the first region; and etching the target etching layer by using the plurality of etch mask patterns as a mask.

14 Claims, 3 Drawing Sheets

METHOD FOR FABRICATING SEMICONDUCTOR DEVICE

FIELD OF THE INVENTION

The present invention relates to a method for fabricating a semiconductor device; and more particularly, to a method for forming a fine pattern in a semiconductor device.

DESCRIPTION OF RELATED ARTS

As well known, a semiconductor device includes a plurality of transistors, and the plurality of transistors are patterned along with a gate insulation layer interposed between the transistors and a substrate.

Particularly, a memory device such as a dynamic random access memory device (DRAM) is provided with a plurality of gate structures constituting cell transistors and peripheral transistors. Densities of gate patterns in the cell region where the cell transistors are formed and the peripheral region get different.

Meanwhile, a line width of a gate structure has been gradually scaled down. However, there are a lot of difficulties in forming a fine pattern due to a collapse of a photoresist pattern for forming the fine pattern.

FIGS. 1A to 1D are cross-sectional views illustrating a conventional method for forming a gate structure.

As shown in FIG. 1A, a gate insulation layer 12, a polysilicon layer 13, a silicide layer 14 are sequentially deposited on a substrate 11. At this time, the gate insulation layer 12 is deposited in a thickness of approximately 50 Å; the polysilicon layer 13 is deposited in a thickness ranging from approximately 600 Å to approximately 800 Å; and the silicide layer 14 is deposited in a thickness ranging from approximately 900 Å to approximately 1,100 Å.

As shown in FIG. 1B, a hard mask nitride layer 15 and an anti-reflective coating layer 16 are sequentially deposited on the silicide layer 14.

As shown in FIG. 1C, a photoresist layer (not shown) is deposited on the anti-reflective coating layer 16 and a photoresist pattern is formed by performing photo-exposure and developing processes using a gate mask.

Afterwards, the anti-reflective coating layer 16 and the hard mask nitride layer 15 are etched by using the photoresist pattern (not shown) as an etch mask and then, the photoresist pattern is removed. Herein, reference numerals 15A and 16A denote a patterned hard mask layer and a patted anti-reflective coating layer, respectively. After the photoresist pattern is removed, a cleaning process is employed and then, a thin native oxide layer 17 is formed on an exposed portion of the silicide layer 14. The native oxide layer 17 should be removed to prevent a pilling phenomenon of a semiconductor device and contamination by impurity particles.

As shown in FIG. 1D, the polysilicon layer 13 and the silicide layer 14 are etched by using the patterned anti-reflective coating layer 16A and the patterned hard mask nitride layer 15A as an etch mask. Herein, reference numerals 13A and 14A denote a patterned polysilicon layer 13A and a patterned silicide layer, respectively.

At this time, the etching process comprises three steps. First, the native oxide layer 17 is removed by using a tetrafluoromethane ($CF_4$) gas. Then, predetermined portions of the silicide layer 14 and the polysilicon layer 13 are etched by using an etching gas selected from a group consisting of nitrogen trifluoride ($NF_3$), chlorine ($Cl_2$), oxygen ($O_2$) and nitrogen ($N_2$). Next, a remaining portion of the polysilicon layer 13 is etched by using a mixed gas of hydrogen bromide (HBr) and $O_2$, thereby forming the patterned polysilicon layer 13A.

As described above, a line width of the hard mask is determined by a line width of the photoresist pattern and the line width of the hard mask determines a line width of the gate structure. Accordingly, to make the line width of the gate structure fine, the line width of the photoresist pattern is compelled to be finer. However, in case of decreasing the line width of the photoresist pattern below a predetermined size, the photoresist pattern cannot tolerate to this scaling-down, thereby getting collapsed due to a lack of adhesiveness between the photoresist pattern and bottom layers.

SUMMARY OF THE INVENTION

It is, therefore, an object of the present invention to provide a method for fabricating a semiconductor device with a fine gate structure without decreasing a line width of a photoresist pattern.

In accordance with the present invention, there is provided a method for fabricating a semiconductor device, including the steps of: forming a target etching layer on a substrate; forming a plurality of etch mask patterns with high pattern density in a first region and a low pattern density in a second region on the target etching layer; removing a native oxide layer grown on the target etching layer such that a line width of each etch mask pattern decreases in more extents in the second region than in the first region; and etching the target etching layer by using the plurality of etch mask patterns as a mask.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, detailed descriptions on a preferred embodiment of the present invention will be provided with reference to the accompanying drawings.

Figure 1A:
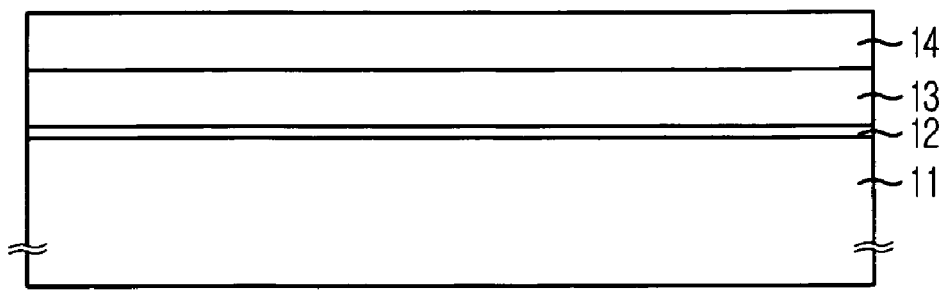
FIGS. 1A to 1D are cross-sectional views illustrating a conventional method for fabricating a gate line of a semiconductor device.
Figure 1B:
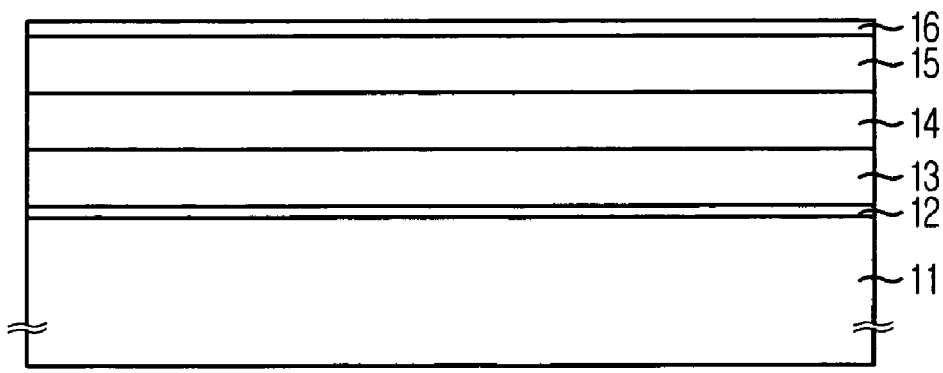
Figure 1C:
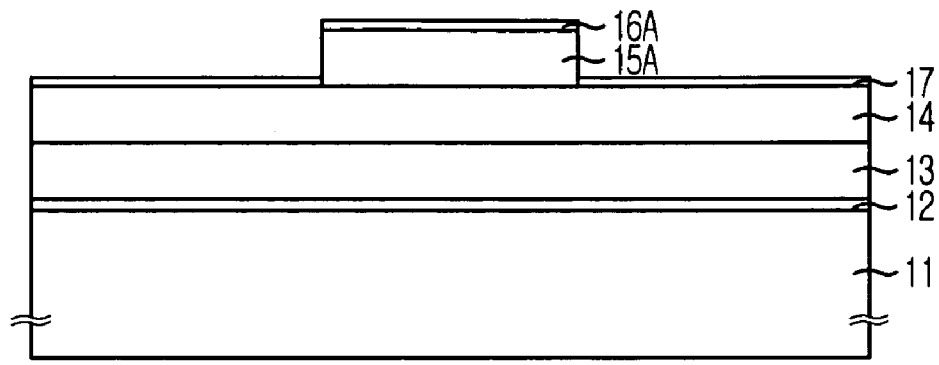
Figure 1D:
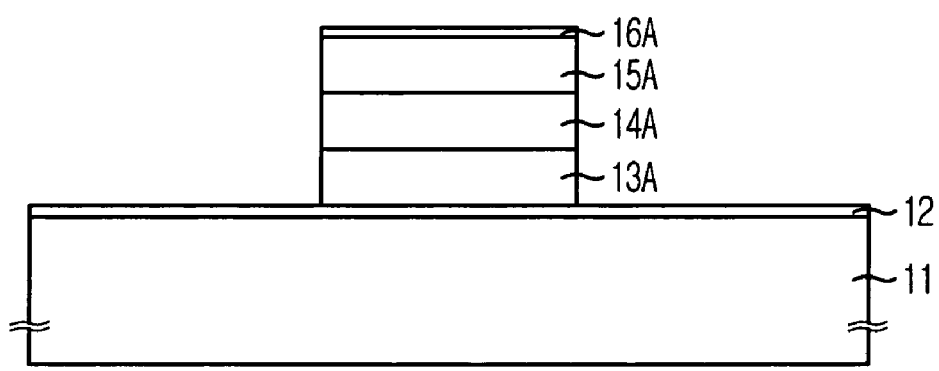
Figure 2A:
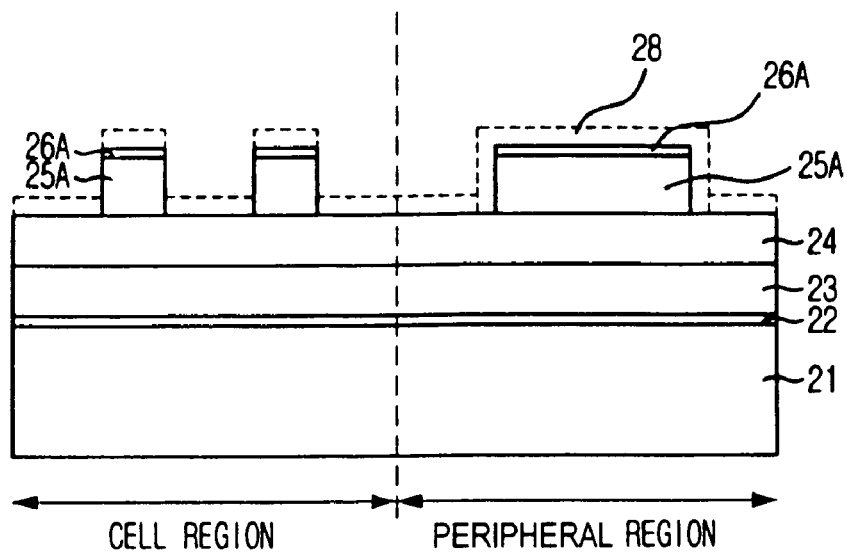
FIGS. 2A and 2B are cross-sectional views illustrating a method for fabricating gate structures in a semiconductor device in accordance with the present invention.
Figure 2B:
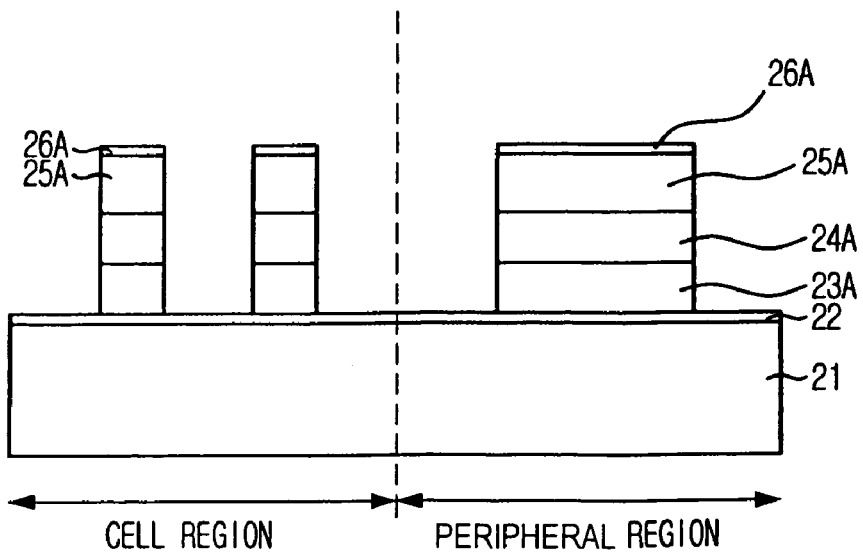

FIGS. 2A and 2B are cross-sectional views illustrating a method for forming gate structures in accordance with the present invention.

As shown in FIG. 2A, a gate insulation layer 22, a polysilicon layer 23, and a silicide layer 24 are sequentially formed on a substrate 21. At this time, the gate insulation layer 22 is formed in a thickness of approximately 50 Å; the polysilicon layer 23 is formed in a thickness ranging from approximately 600 Å to approximately 800 Å; and the silicide layer 24 is formed in a thickness ranging from approximately 900 Å to approximately 1,100 Å. Subsequently, a hard mask nitride layer 25 and an anti-reflective coating layer 26 are sequentially formed on the silicide layer 24. Herein, the silicide layer is preferably based on tungsten (W).

Although not illustrated, a photoresist layer is formed on the anti-reflective coating layer 26 and then, a photoresist pattern is formed by employing photo-exposure and developing processes using a gate mask.

Afterwards, the hard mask nitride layer 25 and the anti-reflective coating layer 26 are etched by using the photoresist pattern as an etch mask and afterwards, the photoresist pattern is removed. Herein, reference numerals 25A and 26A denote a patterned hard mask nitride layer 25A and a patterned anti-reflective coating layer 26A, respectively. After the photoresist pattern is removed, a cleaning process is performed. Then, a thin native oxide layer (not shown) is formed on the exposed portion of the silicide layer 24 after the cleaning process is completed. The native oxide layer should be removed to prevent a pilling phenomenon of a semiconductor device and contamination by impurity particles.

Subsequently, the polysilicon layer 23 and the silicide layer 24 are etched through an etching process by using the patterned anti-reflective coating layer 26A and the patterned hard mask nitride layer 25A as an etch mask. Hereinafter, the etching process comprised of three steps will be explained in detail with reference to FIG. 2B.

First, as a first step, a line width of the patterned hard mask nitride layer 25A in a peripheral region is decreased as the native oxide layer is removed.

Conditions for the above etching process to decrease the line width of the patterned hard mask nitride layer 25A are as follows.

A fluorine based gas such as tetrafluoromethane ($CF_4$) or hexaflouoroethane ($C_2F_6$) is used. A bias power is not provided and only a decreased level of a source power is provided. At this time, the source power ranges from approximately 300 W to approximately 500 W. Furthermore, a chamber pressure is maintained in a range from approximately 50 mtorr to approximately 300 mtorr. An oxygen gas is flowed in a small amount ranging from approximately 5 sccm to approximately 15 sccm. Accordingly, this specific etch recipe induces a chemical etching rather than a physical etching by providing only the source power decreased below a certain level and the chamber pressure increased to a certain level. Also, a plasma etching process is one possible example of the etching process.

Also, it should be noted that the above etching process is performed differently in a cell region where gate patterns are arranged narrowly and a peripheral region where gate patterns are arranged widely. That is, in the cell region, etching ions cannot be provided between the narrowly arranged shape gate patterns because of an increase of the chamber pressure with no supply of bias power. On other hand, in the peripheral region, the etching ions get into spaces created between arranged gate patterns, thereby etching lateral sides of the gate patterns. Accordingly, a line width of each gate pattern in the peripheral regions becomes decreased because of etching the lateral sides of the gate patterns. As shown in FIG. 2A, a reference numeral 28 denotes the decreased portion of the line width of the gate patterns in the peripheral region. Also, the gate pattern includes the patterned anti-reflective coating layer 26A and the patterned hard mask nitride layer 25A.

Furthermore, an addition of the $O_2$ gas serves a passivation role by capping a top portion of the patterned anti-reflective coating layer 26A. This passivation role of the $O_2$ gas makes it possible to etch the patterned anti-reflective coating layer 26A and the patterned hard mask nitride layer 25A in a horizontal direction without an over-etching in the cell region. In the peripheral region, on the other hand, the passivation role of the $O_2$ gas makes it possible to decrease the line width of the gate pattern in mere extents due to an over-etching of the gate pattern caused by a higher amount of the etching ions resulted from an earlier accessibility to the peripheral region.

Afterwards, as a second step, the silicide layer 24 and a portion of the polysilicon layer 23 are etched in a predetermined thickness, and then, as a third step, a remaining portion of the polysilicon layer 23 is completely etched.

Although the above preferred embodiment exemplifies formation of a gate structure, the present invention can be applied to other patterns.

The present invention provides an effect of forming a gate structure with a fine line width even without decreasing a line width of a photoresist pattern.

The present application contains subject matter related to the Korean patent application No. KR 2004-0069027, filed in the Korean Patent Office on Aug. 31, 2004 the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising the steps of:

forming a target etching layer on a substrate;

forming a plurality of etch mask patterns with high pattern density in a first region and a low pattern density in a second region on the target etching layer;

removing a native oxide layer grown on the target etching layer by a plasma etching process performed without providing a bias power such that a line width of each etch mask pattern decreases in more extents in the second region than in the first region; and etching the target etching layer by using the plurality of etch mask patterns as a mask.

2. The method of claim 1, wherein the first region and the second region are a cell region and a peripheral region, respectively.

3. The method of claim 1, wherein at the step of removing the native oxide layer, a chemical etching is induced rather than a physical etching, thereby differentiating a line width decrease in the second region from that in the first region based on a different pattern density.

4. The method of claim 1, wherein as a method for inducing the chemical etching rather than the physical etching, the plasma etching process is performed by increasing a chamber pressure.

5. The method of claim 4, wherein the target etching layer includes a tungsten silicide layer and a polysilicon layer, and the plurality of etch mask patterns includes an anti-reflective coating layer and a nitride layer.

6. The method of claim 5, wherein the etching process for removing the native oxide layer is performed in a gaseous atmosphere by adding an oxygen gas to fluorine-based gas.

7. The method of claim 6, wherein the chamber pressure is maintained in a range from approximately 50 mtorr to approximately 300 mtorr.

8. A method for fabricating a semiconductor device, comprising:

forming a target etching layer on a substrate;

forming an etch mask layer on the target etching layer, wherein the etch mask layer includes an anti-reflective coating layer and a nitride layer;

forming a patterned photoresist layer;

etching the etch mask layer by using the patterned photoresist layer for patterning the etch mask layer;

removing a native oxide layer grown on the target etching layer for decreasing a width of a patterned etch mask layer; and etching the target etching layer by using the patterned etch mask layer.

9. The method of claim 8, wherein the target etching layer includes a tungsten silicide layer and a polysilicon layer.

10. The method of claim 9, further comprising forming a gate insulating layer between the substrate and the target etching layer.

11. The method of claim 8, wherein at the step of removing the native oxide layer, a chemical etching is induced rather than a physical etching, thereby differentiating a width decrease based on a different density of the patterned etch mask layer.

12. The method of claim 11, wherein as a method for inducing the chemical etching rather than the physical etching, a plasma etching process is performed without providing a bias power while a chamber pressure is increased.

13. The method of claim 12, wherein the etching process for removing the native oxide layer is performed in a gaseous atmosphere by adding an oxygen gas to fluorine-based gas.

14. The method of claim 13, wherein the chamber pressure is maintained in a range from approximately 50 mtorr to approximately 300 mtorr.

* * * * *